United States Patent
Padmanaban et al.

[11] Patent Number: 6,114,085
[45] Date of Patent: Sep. 5, 2000

[54] ANTIREFLECTIVE COMPOSITION FOR A DEEP ULTRAVIOLET PHOTORESIST

[75] Inventors: Munirathna Padmanaban; Ralph R. Dammel, both of Flemington, N.J.; Stanley A. Ficner, Bethlehem, Pa.; Joseph E. Oberlander, Phillipsburg; John P. Sagan, Blairstown, both of N.J.

[73] Assignee: Clariant Finance (BVI) Limited, Virgin Islands (Br.)

[21] Appl. No.: 09/195,057

[22] Filed: Nov. 18, 1998

[51] Int. Cl.$^7$ ...................................................... G03F 7/004
[52] U.S. Cl. ..................... 430/270.1; 430/271.1; 430/325
[58] Field of Search ................... 430/271.1, 325, 430/270.1

[56] References Cited

U.S. PATENT DOCUMENTS

| | | | |
|---|---|---|---|
| 4,491,628 | 1/1985 | Ito et al. | 430/176 |
| 5,350,660 | 9/1994 | Urano et al. | 430/176 |
| 5,625,020 | 4/1997 | Bieyta et al. | 526/329.2 |
| 5,652,317 | 7/1997 | McCulloch et al. | 526/312 |
| 5,843,624 | 12/1998 | Houlihan et al. | 430/296 |
| 5,851,730 | 12/1998 | Thackeray et al. | 430/271.1 |
| 5,919,601 | 7/1999 | Nguyen et al. | 430/278.1 |

FOREIGN PATENT DOCUMENTS

| | | |
|---|---|---|
| 542 008 | 2/1993 | European Pat. Off. . |
| 583 205 | 8/1995 | European Pat. Off. . |
| 794 458 | 3/1996 | European Pat. Off. . |
| 2 320 718 | 4/1986 | United Kingdom . |

OTHER PUBLICATIONS

C. Nolscher, Proc.SPIE vol. 1086, p. 242 (1989).
K. Bather, H. Schreiber, Thin Solid Films, 200, 93, (1991).
G. Czech, Microelectronic Engineering, 21, p. 51 (1993).
Proceeding SPIE, vol. 1086 p. 106, (1989).

*Primary Examiner*—Cynthia Hamilton
*Assistant Examiner*—Rosemary Ashton
*Attorney, Agent, or Firm*—Sangya Jain

[57] ABSTRACT

The present invention relates to a novel antireflecting coating composition, where the composition comprises a polymer, thermal acid generator and a solvent composition. The invention further comprises processes for the use of such a composition in photolithography. The composition strongly absorbs radiation ranging from about 130 nm (nanometer) to about 250 nm.

17 Claims, No Drawings

ANTIREFLECTIVE COMPOSITION FOR A DEEP ULTRAVIOLET PHOTORESIST

BACKGROUND

The present invention relates to novel antireflective coating compositions and their use in image processing by forming a thin layer of the novel antireflective coating composition between a reflective substrate and a photoresist coating. Such compositions are particularly useful in the fabrication of semiconductor devices by photolithographic techniques, especially those requiring exposure with deep ultraviolet radiation.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has lead to the use of new photoresists that are sensitive to lower and lower wavelengths of radiation and has also lead to the use of sophisticated multilevel systems to overcome difficulties associated with such miniaturization.

High resolution, chemically amplified, deep ultraviolet (100–300 nm) positive and negative tone photoresists are available for patterning images with less than quarter micron geometries. There are two major deep ultraviolet (uv) exposure technologies that have provided significant advancement in miniaturization, and these are lasers that emit radiation at 248 nm and 193 nm. Examples of such photoresists are given in the following patents and incorporated herein by reference, U.S. Pat. No. 4,491,628, U.S. Pat. No. 5,350,660, EP 794458 and GB 2320718. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by not having aromatics present. Furthermore, at lower wavelengths the reflection from the substrate becomes increasingly detrimental to the lithographic performance of the photoresist. Therefore, at these wavelengths antireflective coatings become critical.

The use of highly absorbing antireflective coatings in photolithography is a simpler approach to diminish the problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the resist film as the thickness of the resist changes. Reflective notching becomes severe as the photoresist is patterned over substrates containing topographical features, which scatter light through the photoresist film, leading to line width variations, and in the extreme case, forming regions with complete photoresist loss.

In the past dyed photoresists have been utilized to solve these reflectivity problems. However, it is generally known that dyed resists only reduce reflectivity from the substrate but do not substantially eliminate it. In addition, dyed resists also cause reduction in the lithographic performance of the photoresist, together with possible sublimation of the dye and incompatibility of the dye in resist films.

In cases where further reduction or elimination of line width variation is required, the use of bottom antireflective coating provides the best solution for the elimination of reflectivity. The bottom antireflective coating is applied to the substrate prior to coating with the photoresist and prior to exposure. The resist is exposed imagewise and developed. The antireflective coating in the exposed area is then etched, typically in an oxygen plasma, and the resist pattern is thus transferred to the substrate. The etch rate of the antireflective film should be relatively high in comparison to the photoresist so that the antireflective film is etched without excessive loss of the resist film during the etch process. Inorganic types of antireflective coatings include such films as TiN, TiON, TiW and spin-on organic polymer in the range of 30 NM, and are discussed in the following papers: C. Nolscher et al., Proc SPIE vol. 1086, p242 (1989); K. Bather, H. Schreiber, Thin solid films, 200, 93, (1991); G. Czech et al., Microelectronic Engineering, 21, p. 51 (1993). Inorganic B.A.R.C.s require precise control of the film thickness, uniformity of film, special deposition equipment, complex adhesion promotion techniques prior to resist coating, separate dry etching pattern transfer step, and dry etching for removal.

Organic B.A.R.C.s are more preferred and have been formulated by adding dyes to a polymer coating (Proc. SPIE, Vol. 1086 (1989), p. 106). Problems of such dye blended coatings include 1) separation of the polymer and dye components during spin coating 2) dye stripping into resist solvents, and 3) thermal diffusion into the resist upon the baking process. All these effects cause degradation of photoresist properties and therefore are not the preferred composition.

Light absorbing, film forming polymers are another option. Polymeric organic antireflective coatings are known in the art as described in EP 583,205, and incorporated herein by reference. However, the antireflective films as disclosed in EP 583,205 are cast from organic solvents, such as cyclohexanone and cyclopentanone. The potential hazards of working with such organic solvents, have lead to the development of the antireflective coating composition such as those disclosed in U.S. Pat. No. 5,652,317, where the solid components of the antireflective coating are both soluble and spin castable from solvents having lesser toxicity hazards. The preferred solvents that are known in the semiconductor industry to have low toxicity, among others, are propylene gycol monomethyl ether acetate (PGMEA), propylene gycol monomethyl ether (PGME), and ethyl lactate (EL). Another advantage of using antireflective coatings soluble in the preferred, lower toxicity solvents, is that these same solvents can also be used to remove the edge bead of the antireflective coating and no additional hazards or equipment expense is incurred, since these solvents are also used for photoresist and photoresist processing. The polymers of the inventions disclosed in the prior art, constitute polymers where the chromaphore is pendant from the backbone of the polymer and where the chromophore, which is typically aromatic, absorbs at wavelengths such as 436 nm, 365 nm and 248 nm, where the photoresist is exposed. These polymers have been found to be ineffective when used as antireflective coatings for photoresists sensitive to 193 nm. It is believed that such antireflective polymers are very aromatic in nature and thus are too reflective, acting as a mirror rather than absorbers. Additionally, these polymers being highly aromatic, have too low a dry etch rate, relative to the new type of nonaromatic photoresists used for 193 nm exposure, and are therefore ineffective for imaging and etching. Photoresist patterns may be damaged or may not be transferred exactly to the substrate if the dry etch rate of the antireflective coating is similar to or less than the etch rate of the photoresist coated on top of the antireflective coating.

The antireflective composition disclosed in EP 542 008, is based on highly aromatic polymers, such as novolaks, polyvinyl phenols, copolymers of polyvinyl phenol and styrene or alphamethyl styrene, etc. Furthermore, this antireflective coating must be able to crosslink with the photoresist, where the photoresist is based on a polyvinylphenol resin sensitive at 248 nm. However, the high degree of aromaticity in the antireflective coating and the photoresist and the low etch rates of novolaks, polyvinylphenols, etc. are detrimental to the imaging process at 193 nm. Therefore, it is necessary to have a bottom antireflective coating that functions well at exposures less than 230 nm.

The novel antireflective coatings of the present invention have been found to have good dry etching properties, which enable a good image transfer from the photoresist to the substrate, and also good absorption characteristics to prevent reflective notching and line width variations or standing waves, particularly at 193 nm. Additionally, substantially no intermixing is present between the antireflective coating and the photoresist film. The antireflective coatings also have good solution stability and form particularly thin films with good coating quality, the latter being particularly advantageous for lithography. When the antireflective coating is used with a photoresist in the imaging process, clean images are obtained.

SUMMARY

The present invention relates to a novel antireflecting coating composition suitable for use with a photoresist, where the composition comprises a copolymer, thermal acid generator and a solvent composition. The invention further comprises processes for the use of such a composition in photolithography. The composition strongly absorbs radiation ranging from about 130 nm (nanometer) to about 250 nm.

The polymer of the novel composition has the structure, (1)

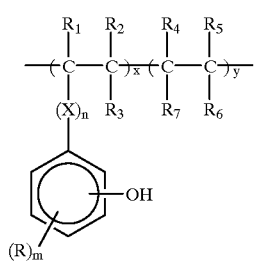

where,

X is $CO_2$, O or $SO_2$ and n=0 or 1, x is an integer and y is 0 or an integer, providing when n=0, y is an integer, R is hydrogen, halogen, nitro, alkyl($C_1$–$C_4$), alkoxy ($C_1$–$C_4$) or esters($C_1$–$C_4$), and, m=1–4, $R_1$ to $R_7$ are independently hydrogen, halogen, alkyl ($C_1$–$C_4$), alicyclic group, alkoxy($C_1$–$C_4$), esters ($C_1$–$C_4$), $CO_2$ (alkyl)OH, $CO_2$(alkyl)$COCH_2COCH_3$, further where $R_7$ and $R_6$ are combined to form a saturated ring or anhydride.

Preferably the polymers are poly(hydroxystyrene-methyl methacrylate), poly(hydroxyphenyl methacrylate-methyl methacrylate), poly(hydroxyphenyl methacrylate) or mixtures thereof.

The thermal acid generator is activated above 90° C., preferably above 150° C. and more preferably above 190° C.

The solvents of the novel composition are organic solvents, in particular solvents that are of low toxicity and additionally have good coating and solubility properties. The preferred choice of organic solvents that are well known for having low toxicity and are also useful for dissolving the solid components of the present composition, are propylene glycol monomethyl ether acetate (PGMEA), propylene glycol monomethyl ether (PGME), ethyl lactate (EL), and 2-heptanone, although other low toxicity solvents can also be used alone or as mixtures.

The invention also relates to an article comprising a substrate with a layer of the novel antireflective coating composition and having thereon a coating of photoresist comprising a non-aromatic polymer, a photoactive compound and a photoresist solvent.

The invention further comprises a process for forming an image on a substrate. The substrate is coated with the film of the antireflective coating of the instant invention and heated to remove any residual solvent and to insolubilize the coating. A film from a photoresist solution is then formed on top of the antireflective coating and further heated to substantially remove the photoresist solvent. The photoresist film is imagewise exposed through a mask with ultraviolet radiation ranging from about 130 nm to about 300 nm, preferably comprising a non-aromatic polymer sensitive at 193 nm, and processed in an aqueous alkaline developer to give a photoresist pattern. Preferably the photoresist comprises a non-aromatic polymer, a photoactive compound and a photoresist solvent. The substrate may be heated prior to and after the development step to give an image of superior quality. The exposed antireflective film can then be dry etched, usually in an oxygen-containing plasma, with the photoresist pattern acting as an etch mask.

DETAILED DESCRIPTION

The present invention relates to a novel antireflecting coating composition, where the composition comprises a polymer, a crosslinker, a thermal acid generator and a solvent composition. The invention further comprises processes for the use of such a composition in photolithography. The polymer of the novel composition has the structure,

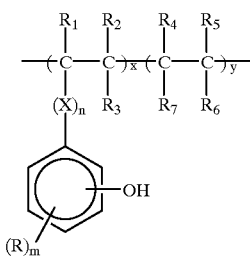

where,

X is $CO_2$, O or $SO_2$ and n=0 or 1, x is an integer and y is 0 or an integer, providing when n=0, y is an integer, R is hydrogen, halogen, nitro, alkyl($C_1$–$C_4$), alkoxy ($C_1$–$C_4$) or esters($C_1$–$C_4$), and, m=1–4, $R_1$ to $R_7$ are independently hydrogen, halogen, alkyl ($C_1$–$C_4$), alicyclic group, alkoxy($C_1$–$C_4$), esters ($C_1$–$C_4$), $CO_2$ (alkyl)OH, $CO_2$(alkyl)$COCH_2COCH_3$, further where $R_7$ and $R_6$ are combined to form a saturated ring or anhydride.

The polymer is particularly effective in absorbing radiation in the deep ultraviolet region, more particularly at about 193 nm.

The polymer of this invention can be a homopolymer of only the phenolic unit, where X is represented by $CO_2$, O or $SO_2$, n=1 and y=0. An example of such a homopolymer is poly(hydroxyphenyl methacrylate). The invention excludes polyhydroxystyrene or novolaks as the main polymeric component.

The polymer of this invention can also include copolymers comprising at least one recurring phenolic unit with the structure (2)

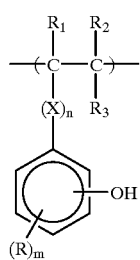

and at least one recurring nonaromatic unit with the structure

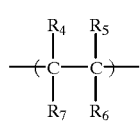

The phenolic unit provides both a crosslinking site as well as a chromophore for absorption in the deep UV region. The hydroxyl group is preferably in the ortho or para position, more preferably in the para position. Other substituents may also be present on the aromatic ring, as long as they are not aromatic and do not contain any conjugation that would lead to absorption in the long ultraviolet, i.e. 320 nm to 450 nm. Excluded would be substituent groups such as —N=N— or —C=C—, which are conjugated to a phenol. It is preferred that substituents to the aromatic ring are hydrogen, alkyl, alkoxy, esters, nitro or halogen; examples of which are methyl, ethyl, propyl, isopropyl, butyl, t-butyl, methoxy, ethoxy, propoxy, butoxy, acetoxy and chloro, more preferably hydrogen, nitro or alkyl. The phenol may be attached directly to the backbone or through the connecting group, X, where X is $CO_2$, $SO_2$ or O, preferably $CO_2$. The copolymer may comprise a single type of phenolic unit or a mixture of two or more types of phenolic units depending on the characteristics desired for the antireflective coating. Different substituents may be used to enhance certain properties, such as, for example, adhesion, solubility, absorbance and film-forming properties. Preferred phenolic monomers for polymerization with the nonaromatic monomer are hydroxystyrene, hydroxyphenyl methacrylate, or mixtures thereof.

The nonaromatic unit may be any unsaturated unit that does not contain aromatic groups. Specific examples of the comonomer useful for polymerization are acrylic or methacrylic acid, acrylates, methacrylates, maleic anhydride, acrylonitrile, vinyl ethers, etc. The nonaromatic comonomer may be used alone or as a mixture of two or more nonaromatic comonomers depending on the characteristics desired for the antireflective coating. Different substituents may be used to enhance certain properties, such as, for example, adhesion, solubility, absorbance and film-forming properties.

The ratio of the phenolic unit and the nonaromatic unit in the copolymer may be varied according to the properties required for the antireflective coating, preferably the phenolic unit ranges from about 35 mole % to about 65 mole %, and more preferably from about 45 mole % to about 55 mole %, particularly where hydroxystyrene or its derivatives are used as the phenolic monomer.

The absorption parameter (k) of the novel composition at 193 nm ranges from about 0.3 to about 0.7, preferably from about 0.5 to about 0.65 as measured using ellipsometry. The value of the refractive index (n) ranges from about 1.25 to about 1.9. Due to the good absorption characteristics of this composition at 193 nm, very thin antireflective films of the order of about 40 nm may be used. This is particularly advantageous when using a nonaromatic photoresist, such as those sensitive at 193 nm, where the photoresist films are thin and must act as an etch mask for the antireflective film. Preferably the film thickness of the antireflective coating is less than 150 nm, and more preferably it is less than 90 nm.

The polymers of this invention may be prepared by any of the standard polymerization methods known in the art, examples of such methods are free radical, anionic or cationic copolymerization techniques. The polymer may be synthesized using solution, emulsion, bulk, suspension polymerization, or the like. The polymer may also be synthesized from capped monomers, for example where the hydroxyl group of the phenolic monomer is blocked with a group like acetoxy before polymerization, and then the capping group is hydrolyzed after the polymer has been synthesized thereby giving the polymer of the present novel composition. The copolymer may have various structures, such as random, block, graft, etc. The weight average molecular weight of the polymer may range from 1500 to about 50,000, preferably 4,000 to about 30,000 and more preferably 5,000 to about 20,000. When the weight average molecular weight is below 1,500, then good film forming properties are not obtained for the antireflective coating and when the weight average molecular weight is too high, then properties such as solubility, storage stability and the like may be compromised.

A variety of crosslinking agents can be used in the composition of the present invention. Any suitable crosslinking agent that can crosslink the polymer in the presence of an acid may be used. Examples of such crosslinking agents are melamines, methylols, glycoluril, hydroxy alkyl amides, epoxy and epoxy amine resins, blocked isocyanates, and divinyl monomers. Melamines like hexamethoxymethyl melamine; glycolurils like tetrakis (methoxymethyl)glycoluril; and aromatic methylols, like 2,6 bishydroxymethyl p-cresol are preferred.

The thermal acid generator of the present invention, is a compound which, when heated to temperatures greater than 90° C. and less than 250° C., generates an acid. The acid, together with the crosslinker, crosslinks the polymer. The antireflective film after heat treatment becomes insoluble in the solvents used for coating photoresists, and furthermore, is also insoluble in the alkaline developer used to image the photoresist. Preferably, the thermal acid generator is activated at 90° C. and more preferably at 150° C., and even more preferably at 190° C. The antireflective film is heated for a sufficient length of time to crosslink the coating. Examples of thermal acid generators are nitrobenzyl tosylates, such as 2-nitrobenzyl tosylate, 2,4-dinitrobenzyl tosylate, 2,6-dinitrobenzyl tosylate, 4-nitrobenzyl tosylate; nitrobenzyl benzenesulfonates such as 2-trifluoromethyl-6-nitrobenzyl 4-chlorobenzenesulfonate, as 2-trifluoromethyl-6-nitrobenzyl 4-nitro benzenesulfonate; phenolic sulfonate esters such as phenyl, 4-methoxybenzenesulfonate.

Thermal acid generators are preferred over free acids, although free acids may also be used, in the novel antireflective composition, since it is possible that over time the shelf stability of the antireflective solution will be effected by the presence of the acid, if the polymer were to crosslink in solution. Thermal acid generators are only activated when the antireflective film is heated on the substrate. Although thermal acid generators are preferred for crosslinking the polymer efficiently, an antireflective composition comprising the polymer and crosslinking agent may also be used, where heating crosslinks the polymer.

The amount of the copolymer in the present composition can vary from about 90 weight % to about 50 weight %, preferably about 85 weight % to about 70 weight % and more preferably about 80 weight % to about 70 weight %, relative to the solid portion of the composition. The amount of the crosslinker in the present composition can vary from 5 weight % to about 50 weight %, preferably 15 weight % to about 30 weight % relative to the solid portion of the composition. The amount of the thermal acid generator in the present composition can vary from 0.1 weight % to about 5 weight %, preferably 0.5 weight % to about 3 weight % and more preferably 1 weight % to about 2 weight %, relative to the solid portion of the composition.

Typical solvents, used as mixtures or alone, that can be used for the present composition are propylene gycol monomethyl ether acetate (PGMEA), propylene gycol monomethyl ether (PGME), and ethyl lactate (EL), 2-heptanone, cyclopentanone, cyclohexanone, and gamma butyrolactone, but PGME, PGMEA and EL or mixtures thereof are preferred. Solvents with a lower degree of toxicity, good coating and solubility properties are generally preferred.

The antireflective coating composition comprises the copolymer, crosslinker and thermal acid generator of the instant invention and a suitable solvent or mixtures of solvents. Other components may be added to enhance the performance of the coating, e.g. monomeric dyes, lower alcohols, surface leveling agents, adhesion promoters, antifoaming agents, etc. Other polymers, such as, novolaks, polyhydroxystyrene, polymethylmethacrylate and polyarylates, may be added to the composition, providing the performance is not negatively impacted. Preferably the amount of this polymer is kept below 50 weight % of the total solids of the composition, more preferably 20 weight %, and even more preferably below 10 weight %.

Since the antireflective film is coated on top of the substrate and is further subjected to dry etching, it is envisioned that the film is of sufficiently low metal ion level and of sufficient purity that the properties of the semiconductor device are not adversely effected. Treatments such as passing a solution of the polymer through an ion exchange column, filtration, and extraction processes can be used to reduce the concentration of metal ions and to reduce particles.

The antireflective coating composition is coated on the substrate using techniques well known to those skilled in the art, such as dipping, spin coating or spraying. The film thickness of the antireflective coating ranges from about 20 nm to about 200 nm. The optimum film thickness is determined, as is well known in the art, to be where no standing waves are observed in the photoresist. It has been unexpectedly found that for this novel composition very thin coatings can be used due to the excellent absorption and refractive index properties of the film. The coating is further heated on a hot plate or convection oven for a sufficient length of time to remove any residual solvent and induce crosslinking, and thus insolubilizing the antireflective coating to prevent intermixing between the antireflective coating and the photoresist layer.

Photoresists can be any of the types used in the semiconductor industry, provided the photoactive compound in the photoresist and the antireflective coating absorb at the exposure wavelength used for the imaging process.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Photoresists sensitive to short wavelengths, between about 130 nm and about 250 nm can also be used where subhalfmicron geometries are required. Particularly preferred are photoresists comprising non-aromatic polymers, a photoacid generator, optionally a solubility inhibitor, and solvent. Photoresists sensitive at 193 nm that are known in the prior art are described in the following references and incorporated herein, EP 794458, WO 97/33198 and U.S. Pat. No. 5,585,219, although any photoresist sensitive at 193 nm may be used on top of the antireflective composition of this invention.

The process of the instant invention further comprises coating a substrate with the novel antireflective coating and heating on a hotplate or convection oven at a sufficiently high temperature for sufficient length of time to remove the coating solvent, and crosslink the polymer to a sufficient extent so that the coating is not soluble in the coating solution of the photoresist or in the aqueous alkaline developer. An edge bead remover may be applied to clean the edges of the substrate using processes well known in the art. The preferred range of temperature is from about 90° C. to about 250° C. If the temperature is below 90° C. then insufficient loss of solvent or insufficient amount of crosslinking takes place, and at temperatures above 250° C. the composition may become chemically unstable. A film of photoresist is then coated on top of the antireflective coating and baked to substantially remove the photoresist solvent. The photoresist is imagewise exposed and developed in an aqueous developer to remove the treated photoresist. The developer is preferably an aqueous alkaline solution comprising, for example, tetramethyl ammonium hydroxide. An optional heating step can be incorporated into the process prior to development and after exposure.

The process of coating and imaging photoresists is well known to those skilled in the art and is optimized for the specific type of resist used. The patterned substrate can then be dry etched in a suitable etch chamber to remove the exposed portions of the antireflective film, with the remaining photoresist acting as an etch mask.

An intermediate layer may be placed between the antireflective coating and the photoresist to prevent intermixing, and is envisioned as lying within the scope of this invention. The intermediate layer is an inert polymer cast from a solvent, where examples of the polymer are polysulfones and polyimides.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

The photoresist used for coating on top of the antireflective coating of this invention was formulated with 3.311 g of a copolymer of mevalonic lactone methacrylate and 2-methyladamantyl methacrylate, 0.1361 g of diphenyliodonium nonafluoro-1-butanesulfonate, 0.00265 g of piperdine ethanol and 20 g of ethyl lactate. The solution was filtered with 0.45 and 0.2 µm filters. 500 nm thick photoresist solution was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed unacceptable standing waves.

EXAMPLE 2 (comparative)

An antireflective coating composition was made by dissolving 1.0 g of poly(4-hydroxystyrene, 0.299 g of tetrakis (methoxymethyl)glycoluril (Powderlink® available from Cytec Industries, West Paterson, N.J.), 0.013 g of p-nitrobenzyl tosylate were dissolved in 49.0 g of ethyl lactate. The solution was filtered through 0.45 and 0.2 µm filters. The n (refractive index) and k (absorption parameter) of the antireflective coating were obtained by baking a silicon wafer coated with the antireflective composition at a temperature of 220° C. for 60 seconds then analyzed by spectroscopic ellipsometry on a J.A. Woollam®VASE spectroscopic ellipsometer in the 185 to 1000 nm range. Data were collected at 450 wavelengths under 6 angles of incidence (55–80° in steps of 5°), resulting in over 2500 separate ellipsometric measurements. All measurements used dynamic averaging. Dynamic averaging is useful in the DUV range where the lamp output is highly decreased.

Initially, the film was analyzed in the wavelength range >400 nm, assuming the film to be a pure dielectric (i.e., transparent). This analysis resulted in the determination of one unknown, film thickness, as well as a set of Cauchy coefficients describing the real part of the refractive index n for the long wavelength range. With the film thickness known from the earlier analysis, the data were then analyzed at each wavelength, leading to a set of dispersion curves n (refractive index) and k (absorption parameter) for each film. Each film was analyzed using this method. The refractive index was found to be 1.73 and the absorption parameter was 0.9013.

The performance of the anti-reflective coating formulation was evaluated using the photoresist of Example 1. About 40 nm thick film was coated and baked at 200° C. for 60 seconds on a silicon wafer with the anti-reflective coating formulation of this Example. Then a 500 nm thick photoresist solution from Example 1 was coated and baked at 115° C. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. Standing waves were observed in the photoresist images.

EXAMPLE 3

An antireflective coating composition was made by dissolving 6 g of poly(4-hydroxystyrene-co-methyl methacrylate (52:48)), 1.8 g of 2,6 bishydroxymethyl p-cresol and 0.078 g of p-toluene sulfonic acid monohydrate in 48 g of 1:1 mixture of ethyl lactate and propylene glycol monomethyl ether acetate. The solution was filtered through 0.45 and 0.2 µm filters. The n (refractive index) and k (absorption parameter) of the antireflective coating were obtained as described in Example 2. The refractive index was found to be 1.466 and the absorption parameter was 0.576. The film thickness loss of the antireflective coating when baked at 200° C. for 60 seconds and soaked in propylene glycol monomethyl ether acetate (PGMEA) for 60 seconds was found to be less than 1.8%. The performance of the anti-reflective coating formulation was evaluated using the photoresist of Example 1. About 40 nm thick film was coated and baked at 200° C. for 60 seconds on a silicon wafer with the anti-reflective coating formulation of this example. Then a 500 nm thick photoresist solution from Example 1 was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves indicating the efficacy of the bottom anti-reflective coating.

EXAMPLE 4

An antireflective coating composition was made by dissolving 3 g of poly(4-hydroxystyrene-co-methyl methacrylate (52:48)), 0.9 g of 2,6 bishydroxymethyl p-cresol and 0.0039 g of p-toluene sulfonic acid monohydrate in 27 g of ethyl lactate. The solution was filtered through 0.45 and 0.2 $\mu$m filters. The n (refractive index) and k (absorption parameter) of the antireflective coating were obtained as described in Example 2. The refractive index was found to be 1.466 and the absorption parameter was 0.576. The film thickness loss of the antireflective coating when baked at 200° C. for 60 seconds and soaked in propylene glycol monomethyl ether acetate (PGMEA) for 60 seconds was found to be 0%. The performance of the anti-reflective coating formulation was evaluated using the photoresist of Example 1. About 40 nm thick film was coated and baked at 200° C. for 60 seconds on a silicon wafer with the anti-reflective coating formulation of this Example. Then a 500 nm thick photoresist solution from Example 1 was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves indicating the efficacy of the bottom anti-reflective coating.

EXAMPLE 5

An antireflective coating composition was made by dissolving 3 g of poly(4-hydroxystyrene-co-methyl methacrylate (52:48)), 0.9 g of 2,6 bishydroxymethyl p-cresol and 0.0039 g of p-nitrobenzyl tosylate in 27 g of ethyl lactate. The solution was filtered through 0.45 and 0.2 $\mu$m filters. The n (refractive index) and k (absorption parameter) of the antireflective coating were obtained as described in Example 2. The refractive index was found to be 1.466 and the absorption parameter was 0.576. The film thickness loss of the antireflective coating when baked at 200° C. for 60 seconds and soaked in propylene glycol monomethyl ether acetate (PGMEA) for 60 seconds was found to be 0%. The performance of the anti-reflective coating formulation was evaluated using the photoresist of Example 1. About 40 nm thick film was coated and baked at 200° C. for 60 seconds on a silicon wafer with the anti-reflective coating formulation of this Example. Then a 500 nm thick photoresist solution from Example 1 was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves indicating the efficacy of the bottom anti-reflective coating.

EXAMPLE 6

An antireflective coating composition was made by dissolving 3 g of poly(4-hydroxystyrene-co-methyl methacrylate (52:48)), 0.9 g of Cymel® 324 (available from Cytec Industries Inc. West Paterson, N.J.) and 0.0195 g of p-nitrobenzyl tosylate in 27 g of ethyl lactate. The solution was filtered through 0.45 and 0.2 $\mu$m filters. The n (refractive index) and k (absorption parameter) of the antireflective coating were obtained as described in Example 2. The refractive index was found to be 1.466 and the absorption parameter was 0.576. The film thickness loss of the antireflective coating when baked at 200° C. for 60 seconds and soaked in propylene glycol monomethyl ether acetate (PGMEA) for 60 seconds was found to be 0%. The performance of the anti-reflective coating formulation was evaluated using the photoresist of Example 1. About 40 nm thick film was coated and baked at 200° C. for 60 seconds on a silicon wafer with the anti-reflective coating formulation of this Example. Then a 500 nm thick photoresist solution from Example 1 was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves indicating the efficacy of the bottom anti-reflective coating.

EXAMPLE 7

An antireflective coating composition was made by dissolving 0.75 g of poly(4-hydroxystyrene-co-methyl methacrylate (52:48)), 0.112 g of Cymel® 324 (available from Cytec Industries, West Paterson, N.J.) and 0.1 12 g of 2,6-bis(hydroxymethtyl p-cresol) and 0.0097 g of p-nitrobenzyl tosylate were dissolved in 36.25 g of ethyl lactate. The solution was filtered through 0.45 and 0.2 $\mu$m filters. The n (refractive index) and k (absorption parameter) of the antireflective coating were obtained as described in Example 2. The refractive index was found to be 1.452 and the absorption parameter was 0.555. The film thickness loss of the antireflective coating when baked at 200° C. for 60 seconds and soaked in propylene glycol monomethyl ether acetate (PGMEA) for 60 seconds was found to be 0%. The performance of the anti-reflective coating formulation was evaluated using the photoresist of Example 1. About 40 nm thick film was coated and baked at 200° C. for 60 seconds on a silicon wafer with the anti-reflective coating formulation of this Example. Then a 500 nm thick photoresist solution from Example 1 was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves indicating the efficacy of the bottom anti-reflective coating.

EXAMPLE 8

An antireflective coating composition was made by dissolving 0.75 g of poly(4-hydroxystyrene-co-methyl methacrylate (52:48)), 0.224 g of tetrakis(methoxymethyl) glycoluril (Powderlink®, available from Cytec Industries, West Paterson, N.J.) and 0.0097 g of p-nitrobenzyl tosylate in 36.25 g of ethyl lactate. The solution was filtered through 0.45 and 0.2 μm filters. The n (refractive index) and k (absorption parameter) of the antireflective coating were obtained as described in Example 2. The refractive index was found to be 1.442 and the absorption parameter was 0.532. The film thickness loss of the antireflective coating when baked at 200° C. for 60 seconds and soaked in propylene glycol monomethyl ether acetate (PGMEA) for 60 seconds was found to be 0%. The performance of the anti-reflective coating formulation was evaluated using the photoresist of Example 1. About 40 nm thick film was coated and baked at 200° C. for 60 seconds on a silicon wafer with the anti-reflective coating formulation of this Example. Then a 500 nm thick photoresist solution from Example 1 was coated and baked at 150° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves indicating the efficacy of the bottom anti-reflective coating.

EXAMPLE 9

An antireflective coating composition was made by dissolving 0.75 g of poly(4-hydroxystyrene-co-methyl methacrylate (52:48)), 0.13 g of hexamethoxymethyl melamine and 0.0097 g of p-nitrobenzyl tosylate in 36.25 g of ethyl lactate. The solution was filtered through 0.45 and 0.2 μm filters. The n (refractive index) and k (absorption parameter) of the antireflective coating were obtained as described in Example 2. The refractive index was found to be 1.445 and the absorption parameter was 0.545. The film thickness loss of the antireflective coating when baked at 2000° C. for 60 seconds and soaked in propylene glycol monomethyl ether acetate (PGMEA) for 60 seconds was found to be 0%. The performance of the anti-reflective coating formulation was evaluated using the photoresist of Example 1. About 40 nm thick film was coated and baked at 200° C. for 60 seconds on a silicon wafer with the anti-reflective coating formulation of this Example. Then a 500 nm thick photoresist solution from Example 1 was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves indicating the efficacy of the bottom anti-reflective coating.

EXAMPLE 10

An antireflective coating composition was made by dissolving 0.75 g of poly(4-hydroxystyrene-co-methyl methacrylate (52:48)), 0.224 g of hexamethoxymethyl melamine and 0.0195 g of p-nitrobenzyl tosylate in 36.25 g of ethyl lactate. The solution was filtered through 0.45 and 0.2 μm filters. The n (refractive index) and k (absorption parameter) of the antireflective coating were obtained as described in Example 2. The refractive index was found to be 1.455 and the absorption parameter was 0.536. The film thickness loss of the antireflective coating when baked at 200° C. for 60 seconds and soaked in propylene glycol monomethyl ether acetate (PGMEA) for 60 seconds was found to be 0%. The performance of the anti-reflective coating formulation was evaluated using the photoresist of Example 1. About 40 nm thick film was coated and baked at 200° C. for 60 seconds on a silicon wafer with the anti-reflective coating formulation of this Example. Then a 500 nm thick photoresist solution from Example 1 was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves indicating the efficacy of the bottom anti-reflective coating.

EXAMPLE 11

An antireflective coating composition was made by dissolving 0.75 g of poly(4-hydroxystyrene-co-methyl methacrylate (52:48)), 0.32 g of tetrakis(methoxymethyl) glycoluril (Powderlink®, available from Cytec Industries, West Paterson, N.J.), 0.0214 g of p-nitrobenzyl tosylate were dissolved in 36.40 g of ethyl lactate. The solution was filtered through 0.45 and 0.2 μm filters. The n (refractive index) and k (absorption parameter) of the antireflective coating were obtained as described in Example 2. The refractive index was found to be 1.456 and the absorption parameter was 0.542. The film thickness loss of the antireflective coating when baked at 200° C. for 60 seconds and soaked in propylene glycol monomethyl ether acetate (PGMEA) for 60 seconds was found to be 0%. The performance of the anti-reflective coating formulation was evaluated using the photoresist of Example 1. About 40 nm thick film was coated and baked at 200° C. for 60 seconds on a silicon wafer with the anti-reflective coating formulation of this Example. Then a 500 nm thick photoresist solution from Example 1 was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves indicating the efficacy of the bottom anti-reflective coating.

EXAMPLE 12

35.6 g (0.2 mol) of 2-hydroxyphenyl methacrylate, 5.01 (0.05 mol) g of methyl methacrylate were dissolved in 60.92 g of dry tetrahydrofuran and to this solution was added 4.06 g of 2,2'-azobisisobutyronitrile (AIBN). The contents were stirred at 70° C. under nitrogen atmosphere for 5 hours. The viscous solution was poured in to isopropanol and the precipitate washed and re-precipitated two more times in isopropanol. Thus 40 g of polymer was isolated, dried under vacuum.

EXAMPLE 13

An antireflective coating composition was made by dissolving 1.0 g of poly(2-hydroxyphenyl methacrylate-co-methyl methacrylate) prepared in Example 12 and 0.32 g of tetrakis(methoxymethyl)glycoluril (Powderlink® available from Cytec Industries, West Paterson, N.J.), 0.013 g of p-nitrobenzyl tosylate were dissolved in 49.0 g of ethyl lactate. The solution was filtered through 0.45 and 0.2 μm filters. The n (refractive index) and k (absorption parameter) of the antireflective coating were obtained as described in Example 2. The refractive index was found to be 1.806 and the absorption parameter was 0.58. The film thickness loss of the antireflective coating when baked at 200° C. for 60 seconds and soaked in propylene glycol monomethyl ether acetate (PGMEA) for 60 seconds was found to be 0%. The performance of the anti-reflective coating formulation was evaluated using the photoresist of Example 1. About 40 nm thick film was coated and baked at 200° C. for 60 seconds on a silicon wafer with the anti-reflective coating formulation of this Example. Then a 500 nm thick photoresist solution from Example 1 was coated and baked at 115° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves indicating the efficacy of the bottom anti-reflective coating.

EXAMPLE 14

53.4 g (0.3 mol) of o-hydroxyphenyl methacrylate was dissolved in 80.1 g of dry tetrahydrofuran and to this solution was added 5.34 g of 2,2'-azobisisobutyronitrile (AIBN). The contents were stirred at 70° C. under nitrogen atmosphere for 5 hours. The viscous solution was poured in to isopropanol and the precipitate washed and re-precipitated two more times in isopropanol. Thus 40 g of polymer was isolated, dried under vacuum.

EXAMPLE 15

An antireflective coating composition was made by dissolving 1.0 g of poly(2-hydroxyphenyl methacrylate) prepared in Example 14 and 0.294 g of tetrakis (methoxymethyl)glycoluril (Powderlink® available from Cytec Industries, West Paterson, N.J.), 0.013 g of p-nitrobenzyl tosylate were dissolved in 49 g of ethyl lactate. The solution was filtered through 0.45 and 0.2 μm filters. The n (refractive index) and k (absorption parameter) of the antireflective coating were obtained by baking a silicon wafer coated with the antireflective composition at a temperature of 220° C. for 60 seconds and measuring the n and k values with an ellipsometer at 193 nm. The refractive index was found to be 1.8087 and the absorption parameter was 0.652. About 40 nm thick film was coated on a silicon wafer with the anti-reflective coating formulation of this example. Then a 500 nm thick photoresist solution from Example 1 was coated and baked at 115° C. The wafer was then exposed using a 193 nm exposure tool. The exposed wafer was baked at 110° C. for 60 seconds and developed using a 2.38 wt % aqueous solution of tetramethyl ammonium hydroxide for 60 seconds. The line and space patterns when observed under scanning electron microscope showed no standing waves indicating the efficacy of the bottom anti-reflective coating.

What is claimed is:

1. A composition especially adapted for forming a non-photoimageable anti-reflective coating for a photoresist sensitive to 193 nm wavelength exposure, comprising a polymer with the structure (1)

where,

X is $CO_2$, O or $SO_2$ and n=0 or 1, x is an integer and y is 0 or an integer, providing when n=0, y is an integer, R is hydrogen, halogen, nitro, alkyl($C_1$–$C_4$), alkoxy ($C_1$–$C_4$) or esters($C_1$–$C_4$), and, m=1–4, $R_1$ to $R_7$ are independently hydrogen, halogen, alkyl ($C_1$–$C_4$), alicyclic group, alkoxy($C_1$–$C_4$), esters ($C_1$–$C_4$), $CO_2$ (alkyl)OH, $CO_2$(alkyl) $COCH_2COCH_3$, further where $R_7$ and $R_6$ are combined to form a saturated ring or anhydride,

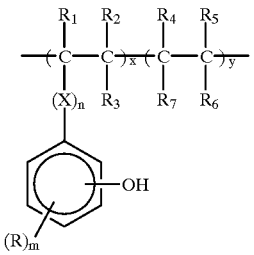

(1)

a crosslinker, a thermal acid generator and a solvent; said composition having an absorption parameter (k) of 0.3 to 0.7 and a refractive index (n) from 1.25 to 1.47 when formed into an anti reflective coating.

2. The composition of claim 1, where the polymer comprises at least one recurring phenolic unit with the structure (2)

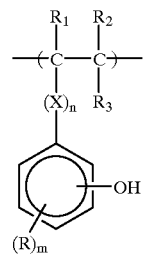

(2)

and at least one recurring nonaromatic unit with the structure

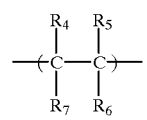

(3)

where,

X is $CO_2$, O or $SO_2$ and n=0 or 1,

R is hydrogen, halogen, nitro, alkyl($C_1$–$C_4$), alkoxy ($C_1$–$C_4$) or esters($C_1$–$C_4$), and, m=1–4, $R_1$ to $R_7$ are independently hydrogen, halogen, alkyl ($C_1$–$C_4$), alicyclic group, alkoxy($C_1$–$C_4$), esters ($C_1$–$C_4$), $CO_2$ (alkyl)OH, $CO_2$(alkyl) $COCH_2COCH_3$, further where $R_7$ and $R_6$ are combined to form a saturated ring or anhydride.

3. The composition of claim 2, where the nonaromatic unit constitutes at least about 35 mole % of the copolymer.

4. The composition of claim 1, where the crosslinker is selected from melamines, methylols, glycolurils, hydroxy alkyl amides, epoxy and epoxy amine resins, blocked isocyanates, and divinyl monomers.

5. The composition of claim 1, where the thermal acid generator is selected from nitrobenzyl tosylates, nitrobenzyl benzenesulfonates and phenolic sulfonates.

6. The composition of claim 1, where the thermal acid generator is activated at above 90° C.

7. The composition of claim 1, where the thermal acid generator is activated at above 150° C.

8. The composition of claim 1, where the thermal acid generator is activated at above 190° C.

9. The composition of claim 1, where the solvent is selected from propylene gycol monomethyl ether acetate, propylene gycol monomethyl ether, and ethyl lactate, 2-heptanone, cyclopentanone, cyclohexanone, and gamma butyrolactone.

10. The composition of claim 1, where the polymer is selected from poly(hydroxystyrene-methyl methacrylate), poly(hydroxyphenyl methacrylate-methyl methacrylate), poly(hydroxyphenyl methacrylate) or mixtures thereof.

11. The composition of claim 1, where the composition further comprises other polymers selected from polyhydroxystyrene, novolak, polyarylate and polymethylmethacrylate.

12. The composition of claim 11, where the amount of other polymer is less than 50 weight % of the total solids.

13. The composition of claim 1, where the composition further comprises additives selected from leveling agents, dyes and adhesion promoter.

14. An article comprising a substrate with a layer of antireflective coating composition of claim 1 and thereon a coating of photoresist comprising a non-aromatic polymer, a photoactive compound and a photoresist solvent.

15. A process for forming an image comprising, a) coating and baking a substrate with the antireflective coating composition of claim 1;

b) coating and baking a photoresist film on top of the antireflective coating;

c) imagewise exposing the photoresist;

d) developing an image in the photoresist;

e) optionally, baking the substrate after the exposing step.

16. The process of claim 15, where the photoresist comprises a non-aromatic polymer, a photoactive compound and a photoresist solvent.

17. The process of claim 15, where the antireflective coating is baked at temperatures greater than 90° C.

* * * * *